United States Patent [19]

Reisman et al.

[11] Patent Number: 5,201,995

[45] Date of Patent: Apr. 13, 1993

[54] ALTERNATING CYCLIC PRESSURE MODULATION PROCESS FOR SELECTIVE AREA DEPOSITION

[75] Inventors: Arnold Reisman; Dorota Temple, both of Raleigh, N.C.

[73] Assignee: MCNC, Research Triangle Park, N.C.

[21] Appl. No.: 852,411

[22] Filed: Mar. 16, 1992

[51] Int. Cl.$^5$ .................... H01L 21/306; B44C 1/22; C23F 1/00; C23C 16/00

[52] U.S. Cl. .................... 156/646; 118/719; 118/721; 156/656; 156/657; 156/662; 156/345; 427/252; 427/255.1; 427/282; 437/228; 437/234; 437/245

[58] Field of Search ............... 156/643, 646, 654, 655, 156/656, 657, 659.1, 662, 663, 664, 665, 666, 667, 345; 437/89, 90, 108, 192, 228, 233, 234, 245; 118/715, 720, 721, 723, 50, 719; 427/51, 248.1, 249, 250, 252, 255.1, 282, 294, 335, 337

[56] References Cited

U.S. PATENT DOCUMENTS

| | | | |
|---|---|---|---|
| 3,232,803 | 2/1966 | Barnett et al. | 156/18 |
| 4,264,393 | 4/1981 | Gorin et al. | 156/345 |
| 4,422,897 | 12/1983 | Horwitz | 156/643 |
| 4,468,283 | 8/1984 | Ahmed | 156/642 |
| 4,497,683 | 2/1985 | Celler et al. | 156/603 |
| 4,518,455 | 5/1985 | Muething | 156/613 |
| 4,578,142 | 3/1986 | Corboy, Jr. et al. | 156/612 |
| 4,617,087 | 10/1986 | Iyer et al. | 156/643 |
| 4,844,775 | 7/1989 | Keeble | 156/643 |
| 4,863,549 | 9/1989 | Grünwald | 156/345 |
| 4,877,479 | 10/1989 | McNeil et al. | 156/626 |
| 4,990,229 | 2/1991 | Campbell et al. | 204/298.06 |
| 5,037,775 | 8/1991 | Reisman | 437/89 |

OTHER PUBLICATIONS

*Chemical Vapor Deposition and Solid-Vapor Equilibria,* A Reisman and T. O. Sedgwick, Academic Press, Inc., 1976, pp. 1–90.

*The Equilibrium Constant for the Reaction of $ZnO+H_2$ and the Chemical Vapor Transport of ZnO Via the $Zn+H_2O$ Reaction,* A. Reisman, M. Berkenblit, R. Ghez, S. A. Chen, Journal of Elec. Materials, vol. 1, No. 3, 1972, pp. 395–419.

*The Epitaxial Growth of ZnO on Sapphire and MgAl Spinel Using the Vapor Phase Reaction of Zn and $H_2O$,* A. Reisman, M. Berkenblit, S. A. Chen, J. Angilello, Journal of Electronic Materials, vol. 2, No. 2, 1973, pp. 177–189.

*Primary Examiner*—William A. Powell
*Attorney, Agent, or Firm*—Bell, Seltzer, Park & Gibson

[57] ABSTRACT

A novel process for the selective deposition of solid-phase materials is disclosed, which process requires only the modulation of a single auxiliary gas within a suitable reactor assembly. According to the disclosed method, selective area deposition can be obtained on any desired microelectronic substrate by the creation of a vapor-phase chemical equilibrium system capable of deposition and etching the material to be deposited. The vapor-phase system is designed around a single reversible reaction wherein the material to be deposited equilibrates between that solid phase and its vapor-phase constituent species. By modulating an auxiliary gas flow into the reactor assembly, alternating deposition and etching processes can be obtained to yield an overall process which results in net overall selective and uniform deposition.

29 Claims, 7 Drawing Sheets

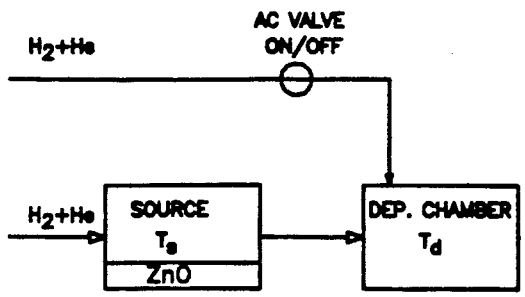
FIG. 2A.
FIG. 2B.
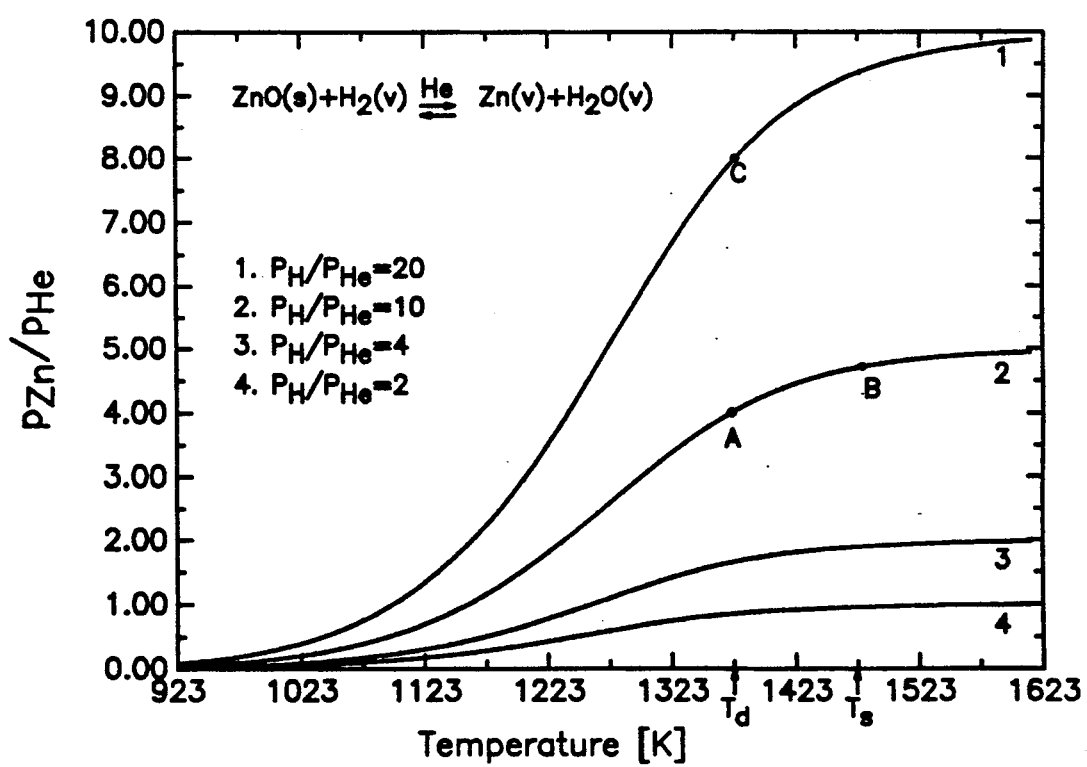

ALTERNATING CYCLIC PRESSURE MODULATION PROCESS FOR SELECTIVE AREA DEPOSITION

FIELD OF THE INVENTION

The present invention relates to chemical vapor deposition and, more particularly, to selective area deposition, i.e. chemical vapor deposition whereby a material is deposited only on selected areas of a substrate.

BACKGROUND OF THE INVENTION

In the manufacture of microelectronic devices such as, for example, integrated circuits, it is often necessary to deposit smooth, uniform layers of materials such as metals or semiconductors on a microelectronic substrate. Amorphous, polycrystalline and monocrystalline layers must often be deposited. In addition, such deposition must sometimes be made through patterned openings in a masking layer applied to the substrate, and without depositing any material on the surface of the masking layer. The substrate may be a semiconductor, a metal or any other material. Thus a recurring problem in this field is how to uniformly deposit such materials and how to do so only at target locations on the substrate surface.

Selectivity can be obtained to a degree where substitution, or displacement reactions occur, i.e. reactions where the exposed substrate material is actually chemically displaced by the material being deposited using chemical vapor deposition methods. Due to the nature of such reactions, however, the deposition obtained generally self-terminates once the exposed surfaces of the substrate become overcoated. The result is a deposited layer generally on the order of 100–1000 Å thick. Because of this inherent self-termination, substitution or displacement reactions do not provide a viable process for deposition to arbitrary thicknesses as is often required.

Another known approach to these problems has been the use of chemical vapor deposition (hereinafter "CVD") in which displacement reactions may or may not take place. Selectively is sought via modifying the sticking coefficients and the masking materials and substrates as best as one is able to. In such processes, the material to be deposited is first chemically vaporized, i.e. chemically converted to vapor-phase species, and then transported through vapor into contact with the substrate. Once these vapor-phase species are exposed to the substrate, conditions are manipulated, almost always by a temperature change, such that the vapor-phase species re-react to chemically condense, or deposit, the desired material. The resultant deposited layer generally blankets the substrate surface. Selectivity obtained by such deposition processes is not controllable to the degree required.

In order to counteract these problems and to enhance selectivity, modified two-stage deposition and etching processes have been developed. In such modified processes, the desired material is deposited on the substrate during a first stage of the process and then etched therefrom in a second stage. Sometimes, these first and second stages are simultaneously carried out. In either event, due to a slight preference for unmasked portions of the substrate during the deposition stage and a more enhanced preference for the masked portions of the substrate during the etching stage, the overall process results in net selective area deposition at the unmasked areas of the substrate.

One known example of such a modified process is disclosed for tungsten deposition in U.S. Pat. No. 4,617,087 to Iyer, et al. The Iyer, et al. process begins with the following substitution reaction:

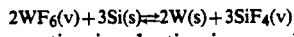

This reaction is selective inasmuch as the gaseous tungsten hexafluoride reacts directly with the exposed areas of the silicon substrate to displace the exposed silicon with deposited tungsten. Once the exposed substrate becomes overcoated, however, the reaction self terminates leaving approximately 100–1000 Å of tungsten on the exposed portions of the substrate.

Once this reaction terminates, hydrogen already present in the reaction chamber causes the following hydrogen reduction reaction to become dominant resulting in further tungsten deposition:

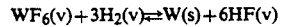

Unlike the above described substitution reaction, the hydrogen reduction reaction is generally non-selective, although some selectivity can be obtained depending on the nucleating characteristics of the substrate material vis-a-vis that of the masking layer.

To counteract the unwanted nucleation of tungsten on the masking layer, Iyer, et al. propose that a third, etching reaction be simultaneously initiated within the reaction system. The etching reaction requires the addition of yet another reactant gas, NF$_3$, into the reaction system. This reaction volatilizes the already deposited tungsten according to the following equations:

 (1)

 (2)

The first of these reactions additionally requires that a plasma source be included within the reactor system.

Because the etching reaction is carried out simultaneously with the deposition reaction, any unwanted tungsten nuclei formed on the surface of the masking layer are immediately volatilized. Nuclei formed on the unmasked surfaces of the substrate are etched to a lesser extent due to their decreased surface areas and the relatively greater sticking coefficient between such nuclei and the tungsten layer already deposited via the substitution reaction. Thus, the overall process results in the desired selectivity. In addition, due to the way in which the deposited layer is formed, uniform layers are obtained.

Several drawbacks or disadvantages, however, are associated with the Iyer, et al. approach. A first is that this method requires the precise control of multiple component sources to feed the involved reactions. In addition, this process involves the expense and burden of maintaining a plasma source within the reactor assembly to fuel the etching phase thereof.

In U.S. Pat. No. 5,037,775 to Reisman, one of the present inventors, and commonly assigned with the present application, an improved selective area deposition process is disclosed for materials such as silicon, germanium and titanium. The Reisman process addresses several of the shortcomings of the Iyer, et al. and other similar selective CVD methods. In the disclosed method, two rather than three reactions are employed to selectively deposit the desired materials. The process involves flowing a gas of a reducible compound of the material to be deposited and a reducing gas into a deposition chamber whereby the gases react to deposit the desired material on the substrate. The reaction is preferential to the exposed areas of the substrate due as indicated, initially in some instances to a displacement reaction, and subsequently the differences in the nucleation characteristics of the masking layer versus the exposed substrate. Some unwanted nucleation of the deposited material on the surface of the masking layer, however, sooner or later obtains. To remove this unwanted nucleation, the flow of the reducing gas is interrupted, causing a second, embedded, etching reaction to become dominant within the reactor. In this reaction, the reducible compound reacts with the deposited material in a disproportionation reaction to convert the deposited material to a volatile species under the experimental conditions employed. The flow of the reducing gas is thereafter restarted and deposition resumes. This two stage cycle is repeated to alternatingly deposit and etch the deposited material on and from the substrate, respectively in a periodic cyclic fashion. Uniquely, the same reducible compound of the deposited material is employed to both deposit and then etch the desired material, thus reducing the number of reactants involved in the overall system.

An example of the Reisman method can be described for silicon deposition wherein silicon tetrachloride is employed in the following hydrogen reduction reaction:

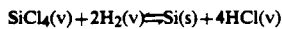

$$SiCl_4(v) + 2H_2(v) \rightleftharpoons Si(s) + 4HCl(v)$$

As long as a sufficient supply of hydrogen is available within the deposition chamber, the reaction will proceed to the right as written, according to the equilibrium constant for the reaction. Coincidentally, because the standard enthalpy of the reaction is positive, the reaction is also driven to the right with increasing temperature. As the reaction proceeds in this way, silicon is deposited on the substrate. However, when the flow of hydrogen is interrupted and the remaining hydrogen becomes mostly depleted, a second, embedded, etching reaction, becomes dominant:

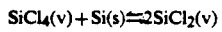

$$SiCl_4(v) + Si(s) \rightleftharpoons 2SiCl_2(v)$$

Thus, by cyclically modulating the flow of hydrogen into the deposition chamber, the respective dominance of the deposition and etching reactions can be controlled within the reactor. The etch rate of the deposited nuclei (when they are small) from the masked areas is greater than that from the unmasked areas on the substrate because of the higher surface energy and greater surface exposure of the unwanted nuclei. Consequently, the cyclical process results in a net preferential deposition in the unmasked areas of the substrate.

This type of reaction can be used to deposit a host of materials, as disclosed in U.S. Pat. No. 5,037,775, the disclosure of which is incorporated herein by reference. However, inasmuch as this method depends upon a disproportionation reaction to etch the unwanted nuclei from the masked regions, it is only useful where the deposited material is capable of existing in at least two distinct vapor-phase valence states and one solid-phase valence state.

In U.S. Pat. No. 4,578,142 to Corboy, Jr., et al., a different two-stage process for selective deposition for silicon is disclosed. In the deposition stage, silicon is deposited from a gas mixture which includes hydrogen and a silicon source gas, such as $SiH_4$, $SiH_3Cl$, $SiH_2Cl_2$, $SiHCl_3$ or $SiCl_4$. In the second stage, the deposited silicon is etched from the masked areas of the substrate in a gas mixture of hydrogen and a silicon etching gas, such as HCl. The two-stage process is cyclically repeated until the desired thickness of silicon is deposited at the unmasked areas of the substrate. The alternating stages of the process are initiated by alternatingly turning on and off the flow of the reducible silicon source gas while simultaneously decreasing and increasing, respectively, the flow of the silicon etching gas.

Like Iyer, et al. and Reisman, Corboy Jr., et al. rely on the preference of the etching reaction for nuclei deposited on the masking layer to achieve the desired result. For this reason, the overall Corboy Jr., et al. process also results in selective deposition. The Corboy, Jr., et al. patent is limited to the deposition of silicon and does not disclose that the disclosed method is useful for depositing any other materials. Again, unlike Reisman who interrupts the flow of the reducing gas while maintaining the flow of the reducible gas, Corboy, Jr. interrupts the flow of the reducible gas and introduces or increases the flow of an etching gas which is a different chemical than either the reducible or reducing gas.

SUMMARY OF THE INVENTION

It is therefore an object of this invention to provide a process for depositing uniform layers of materials such as refractory and nonrefractory metals and semiconductors upon microelectronic surfaces.

It is another object of the present invention to provide such a process by which selective area deposition can be obtained easily and at low cost.

These and other objects of the present invention are provided by a chemical vapor deposition process whereby materials are alternatingly deposited on and then to a lesser extent etched from the surface of a microelectronic substrate by modulating the flow of a vapor-phase component into the deposition system. More particularly, these objects are provided by a process for depositing a layer of a solid-phase material on a substrate located within a chemical reactor, which process involves the steps of, first, continuously combining a predetermined quantity of supply components to produce a confined vapor-phase chemical equilibrium system capable of both depositing and etching the desired material. Next, the produced vapor-phase chemical equilibrium system is transported along with an independent source of an auxiliary gas component, where both the equilibrium system and the auxiliary gas are exposed to the target substrate. At this point in the process, depending on the partial pressures of the several species existing at the target substrate, and the particular chemical system involved, deposition of the desired material will result. Once deposition has occurred for a brief period of time, the flow of the auxiliary gas into the reactor assembly is modulated, such that the deposited material will be temporarily etched from the substrate. Following this, the auxiliary gas flow is restored to again cause another deposition cycle to begin. These alternating deposition and etching processes are thereafter cyclically repeated until the desired thickness of material is deposited on the substrate. Alternatively, deposition may occur when the auxiliary gas flow is turned off and etching may occur when the auxiliary gas flow is turned on, depending on the specific chemistry being employed.

As will be understood, because of the factors described above with respect to known methods, the overall process can be used to obtain selective area deposition where patterned substrates are used. Alternatively, blanket deposition will obtain on unmasked substrate surfaces.

The overall process of the present invention is begun by placing within a first or source region of the reactor a supply of the solid-phase material to be deposited or a source containing such a material where the source may be solid, liquid or vapor, or a combination of such sources from which the desired material may be formed, plus predetermined vapor-phase reactants. This combination will produce a chemical equilibrium system capable of net deposition or net etching of the solid-phase material depending upon the precise conditions employed. In addition, the temperature of the first region of the reactor is controlled to accommodate real-time chemically-assisted volatilization of the solid-phase material. The vapor-phase chemical equilibrium system produced will be defined by the vapor-phase constituents of the chemically-assisted volatilization reaction.

In order to select the appropriate vapor-phase reactants to initiate the creation of the required equilibrium system, both thermodynamic and kinetic criteria for reactions involving the material to be deposited should be considered. In choosing a particular system, a sufficiently reversible reaction wherein the material to be deposited equilibrates between the solid-phase and various vapor-phase precursor species should be identified. As a general rule, a reaction is sufficiently reversible for the purposes of the present invention where changes in temperature within the temperature range of interest cause a shift in the equilibrium position of the reaction during the time allotted for the overall deposition process. The appropriate thermodynamic and kinetic considerations are discussed in detail in *Phase Diagrams*, Vol. IV, *Materials Science and Technology* (Academic Press 1976), *Chemical Vapor Deposition and Solid-Vapor Equilibrium*, A. Reisman and T. Sedgwick, the disclosure of which is incorporated herein by reference.

The following is a nonexclusive list of reversible reactions about which a chemical equilibrium system sufficient to support deposition according to the present invention can be obtained.

$$ZnO(s) + H_2(v) \underset{He}{\rightleftharpoons} Zn(v) + H_2O(v) \quad (1)$$

$$aCu(s) + aHX(v) \underset{H_2}{\rightleftharpoons} Cu_aX_a(v) + a/2\, H_2(v) \quad (2)$$

where X = Cl, Br or I
a = 1, 2 or 3

$$SiX_4(v) + 2H_2(v) \underset{He}{\rightleftharpoons} Si(s) + 4HX(v) \quad (3)$$

where X = Cl, Br or I $$3Al(s) + AlCl_3(v) \underset{He}{\rightleftharpoons} 3AlCl(v) \quad (4)$$

$$GeX_4(v) + 2H_2(v) \underset{He}{\rightleftharpoons} Ge(s) + 4HX(v) \quad (5)$$

where X = Cl, Br or I

-continued $$TiX_4(v) + 2H_2(v) \underset{He}{\rightleftharpoons} Ti(s) + 4HX(v) \quad (6)$$

where X = Cl, Br or I $$2GaX(v) + H_2(v) + 2As(v) \underset{He}{\rightleftharpoons} 2GaAs(s) + 2HX(v) \quad (7)$$

where X = Cl or I $$GeO(v) + H_2(v) \underset{He}{\rightleftharpoons} Ge(s) + H_2O(v) \quad (8)$$

$$WF_6(v) + 3H_2(v) \underset{He}{\rightleftharpoons} W(s) + 6HF(v) \quad (9)$$

Once a suitable chemical system for a given material is chosen and a vapor-phase chemical equilibrium system therefore is created, the required deposition and etching steps can be achieved by mixing the created system in the vapor phase with an independent auxiliary gas component and modulating the latter in a predetermined fashion. Uniquely, the alternating deposition and etching cycles can be achieved simply by modulating the flow of the auxiliary gas component within the reactor assembly. In all cases the production and transportation of the chosen chemical equilibrium system remain constant and continuous without the introduction of additional reactive components or the modulation of those already employed. Thus, the disclosed method is clinically easier to operate and is thus less costly relative to prior methods. In addition, no plasma, laser or other excitation sources are required to initiate any of the required reactions.

According to the invention, the net deposition or net etching processes are initiated by modulating the flow of an auxiliary gas in a continuous process while the flows of all reactant and carrier gases are maintained. In this way, the reversible reaction is always proceeding, in one direction or the other, within the system.

Any material which can participate in a sufficiently reversible reaction as described above may be deposited by the present invention, including solid solutions of materials (commonly called alloys in the case of metals). It will be understood that equilibrium must be at least partially achievable in the temperature interval below the melting point of the desired solid phase. In addition, these materials may be deposited on materials, such as refractory and nonrefractory metals, refractory and nonrefractory metal oxides, refractory and nonrefractory metal nitrides, single element semiconductors, compound semiconductor or alloys thereof, as well as any other substrate materials on which an enhanced degree of nucleation relative to a mask can be obtained. Doped or undoped semiconductors or alloys thereof may be deposited upon doped or undoped semiconductors, alloys thereof, metals, insulators or other known substrate materials. Further, the deposition conditions may be controlled as is known in the art to provide for monocrystalline, polycrystalline or amorphous deposition by optimizing the temperature, gas composition, other reaction conditions within the system, as well as the nature of the chosen substrate.

Thus, the present invention provides a simple alternating cyclic (A.C.) process by which an arbitrary blanket or selective thickness of a material may be deposited on a microelectronic substrate.

BRIEF DESCRIPTION OF THE DRAWINGS

FIGS. 2A and 2B are a schematic drawing of a CVD apparatus in which ZnO may be deposited according to the present invention and a graphical representation of one prototypical deposition reaction for ZnO, respectively.

DESCRIPTION OF A PREFERRED EMBODIMENT

The present invention will now be described more fully hereinafter with reference to the accompanying drawings, in which several preferred embodiments of the invention are shown. The invention may, however, be embodied in many different forms and should not be construed as limited to the embodiments set forth herein. Rather, these embodiments have been provided in an effort to provide a complete and thorough disclosure of the present invention and the best mode contemplated for carrying out the same, and to willfully convey the scope thereof to those skilled in the art.

Figure 1A:
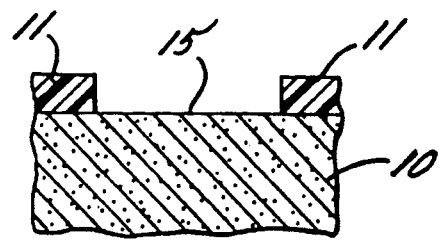
FIGS. 1A, 1B and 1C are schematic cross-sectional views of a portion of an integrated circuit showing a process for selectively depositing materials thereon according to the present invention.

Referring now to FIG. 1A, a microelectronic substrate 10 includes an exposed surface 15 and a patterned mask layer 11. The exposed surface 15 may be a semiconductor, such as silicon, germanium or alloys thereof, metallic or any other known type of deposition substrate. The mask layer 11 may be any material which does not react significantly with the vapor-phase components of the chosen deposition reaction and which can tolerate the temperatures at which that reaction progresses. Normally, the mask layer 11 is made of silicon dioxide, silicon nitride, aluminum oxide or polyimide, although other known mask layers may be used.

Since a substitution reaction is not required to initiate the deposition process of the present invention, it is not necessary that the exposed surface of the substrate be restricted to materials, such as silicon or germanium, capable of undergoing such reactions. In other words, for example, silicon may be deposited on silicon.

Figure 1B:
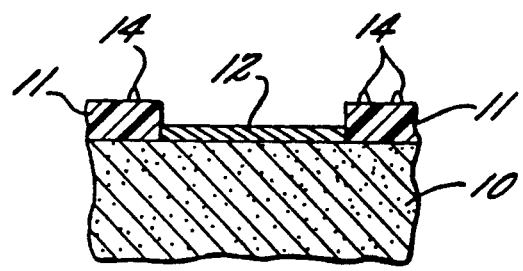

Referring now to FIG. 1B, in order to begin the deposition process according to the invention, a solid-phase supply of the material to be deposited is placed within a first region of the reaction chamber and a flow of the necessary reactive gases and optionally an inert carrier gas is bled therein. In some instances, the reactive gas will be hydrogen gas and the inert carrier gas will be helium, although, as will be seen, other gases may be required to initiate the chemically-assisted volatilization and deposition processes for certain materials. Assuming that appropriate reaction conditions exist, the hydrogen will chemically cause volatilization of the solid-phase material, thus creating the vapor-phase chemical equilibrium system which will become the source atmosphere for the deposition process. In the case of ZnO deposition, a vapor-phase mixture including Zn, $H_2O$, $H_2$ and the inert carrier gas results.

The continuous flow of gases transports the vapor-phase equilibrium system toward the second region of the reactor and into contact with the substrate. In the second region of the reactor, under appropriate reaction conditions, the reaction reverses and the material to be deposited is re-converted to the solid phase (e.g., ZnO) as a layer 12 formed on the unmasked portions of the substrate and as unwanted (spurious) nuclei 14 on the surface of the mask layer 11.

After a predetermined period of time, the partial pressures of the respective vapor-phase components of the chemical equilibrium system are altered by modulating the flow of the auxiliary gas into the reactor assembly, thus causing the etching stage of the process to begin. During the etching cycle, as stated above, the nuclei 14 on the masking layer are etched at a greater rate than is the layer 12 of material deposited on the unmasked regions of the substrate.

Figure 1C:
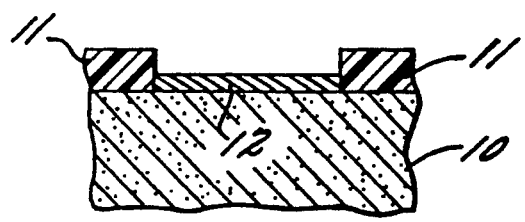

The etching cycle is maintained just long enough for the unwanted nuclei 14 on the masking layer 11 to be entirely removed, but briefly enough to avoid any appreciable etching of the deposited layer 12, as shown in FIG. 1C. The deposition and etching steps are thereafter repeated cyclically until the desired thickness of material has been deposited upon the unmasked regions on the substrate.

The reactive conditions within the reaction chamber can be manipulated according to the present invention in several ways. Some of these ways will now be described individually with respect to ZnO, Cu and Al deposition, although these and other options can be used to yield similar results with other materials. In each of the described options, helium is exemplified as the inert carrier gas, although other inert gases, such as argon, nitrogen or other gases which will not participate in the reactions proceeding within the reactor, may be used instead as desired.

Referring to FIGS. 2A and 2B, there are shown schematically a reactor assembly composed of a first or source region and a second or deposition region (FIG. 2A) and a graphical plot of the component partial pressure ratio $P_{Zn}/P_{He}$ as a function of temperature for chemical equilibrium systems having different component partial pressure ratios designated by $P_H/P_{He}$ (FIG. 2B). Suppose that solid-phase ZnO is maintained in the source region of the reactor at a temperature $T_s$. When a mixture of hydrogen and helium with the partial pressure ratio $P_H/P_{He}$ of, for example, curve 2 in FIG. 2B is flowed through the source region at a rate such that quasi-equilibrium obtains, the component partial pressure ratio $P_{Zn}/P_{He}$ within the source region of the reactor will be equal to that represented by point B in FIG. 2B. If the so created chemical equilibrium system is then transported into the deposition region of the reactor, which region is maintained at a temperature $T_d$, such that $T_d < T_s$, ZnO deposition will occur because the required partial pressure ratio $P_{Zn}/P_{He}$ at equilibrium for temperature $T_d$ (point A in FIG. 2B) is lower than that exhibited by vapor-phase effluent from the source region, according to curve 2 of FIG. 2B. Since the He component of the effluent is, of course, confined to the vapor phase, it can be seen that ZnO deposition must occur as the partial pressure ratio $P_{Zn}/P_{He}$ decreases.

If after a defined time period, during which deposition is allowed to proceed, a sufficient flow of an auxiliary gas is introduced into the deposition region of the reactor via the A.C. valve shown in FIG. 2A, the ratio $P_H/P_{He}$ increases in magnitude to, for example, that of curve 1. The auxiliary gas can be pure hydrogen or a sufficiently hydrogen-rich mixture of $H_2$ and He to raise the $P_H/P_{He}$ component ratio to a value greater than 10/1. In any event, the introduction of the auxiliary gas into the deposition region of the reactor alters the conditions in that region such that the equilibrium position of the reaction about which the equilibrium system was created moves toward the left or, in other words, toward chemically assisted volatilization of the deposited solid-phase material. In order for this to occur, the partial pressure ratio $P_{Zn}/P_{He}$ in the deposition region for the specific case given will tend to increase, for example, from point A to point C. This increase can only occur by conversion of the previously-deposited ZnO back into the vapor phase. This effect defines the etching phase of the process, which as can be seen from FIG. 2B is begun with increased hydrogen partial pressure, i.e. when the A.C. valve shown in FIG. 2A is in the ON position. If the A.C. valve is again turned off, the ratio $P_H/P_{He}$ decreases to that of curve 2, the equilibrium ratio $P_{Zn}/P_{He}$ tends to return to point A and ZnO deposition resumes. Consequently, by alternating the OFF and ON cycles of the A.C. valve, alternating stages of ZnO deposition and etching can be obtained. It should also be realized with reference to FIG. 2B that although only four curves are shown, an infinite number of curves exist. Only four are shown for the sake of clarity. Thus, if the component partial pressure ratio $P_H/P_{He}$ is raised from 10/1 to 10.1/1 etching will occur according to the dictates of a curve, not shown, having this $P_H/P_{He}$ ratio.

As stated above, the spurious ZnO nuclei on the masking layer are preferentially removed during the etching cycle as compared to the ZnO deposited at the unmasked regions because of their high surface energy and relatively high surface exposure. Preferential etching is also aided by sticking coefficient considerations. The overall rate of deposition is not appreciably affected by the intermittent etching cycles. Rather, the etching stages allow for the deposition of uniform material layers.

Figure 3A:
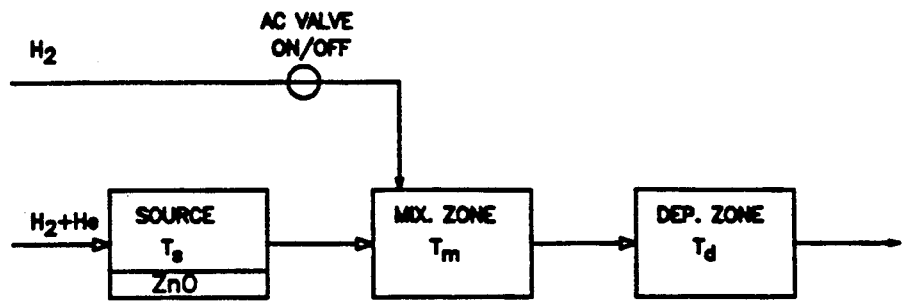
FIGS. 3A, 3B, 4A, 4B, 5A and 5B are similar schematics and graphs depicting alternative apparatuses for and approaches for ZnO deposition according to the present invention.
Figure 3B:
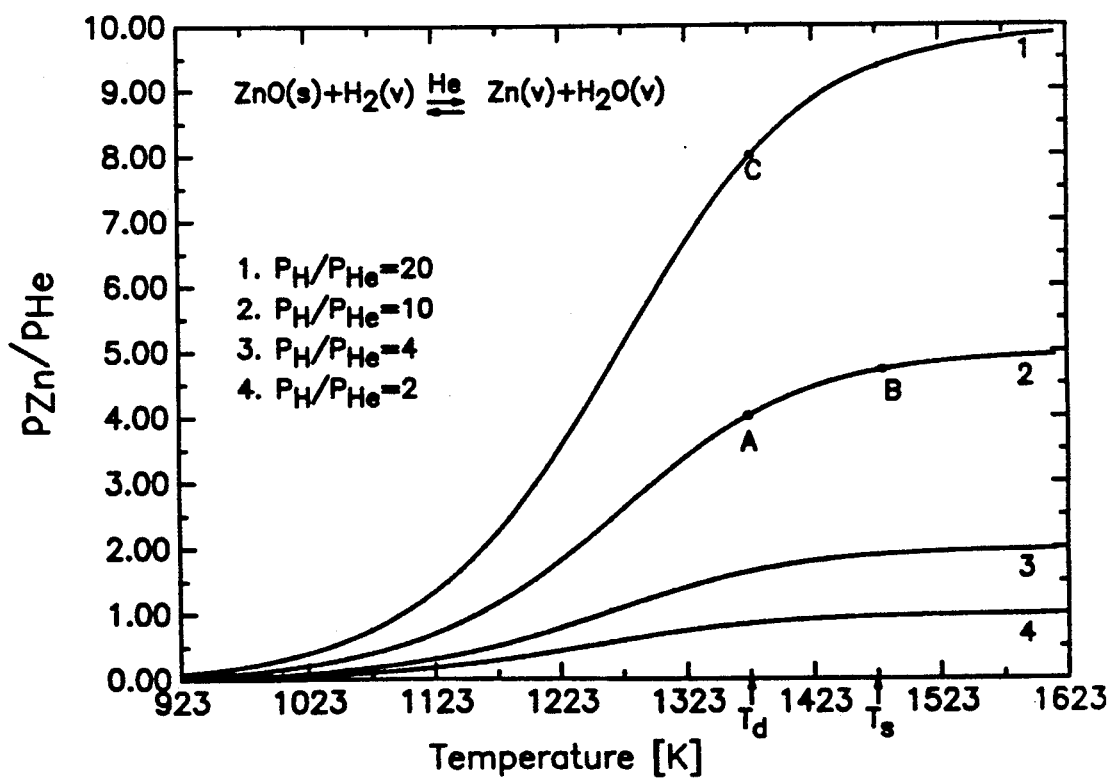

In a slight variation of the above embodiment, another ZnO deposition process can be explained with reference to FIGS. 3A and 3B. This option, as shown in FIG. 3A, requires the addition of a mixing region between the source and deposition regions of the reactor. The mixing region should be maintained at a temperature $T_m$, which can be the same as or slightly higher than the temperature $T_s$ of the source region, depending on the thermodynamics of the chosen reaction. When the vapor-phase effluent from the source region (containing $H_2 + He + Zn(v) + H_2O(v)$), with a partial pressure ratio $P_{Zn}/P_{He}$ of, for example, that referenced by point B in FIG. 3B, reaches the deposition region, ZnO deposition occurs due to the lower temperature $T_d$ of the deposition region (i.e., at $T_d$, the equilibrium value for $P_{Zn}/P_{He}$ is represented by point A on curve 2 of FIG. 3B whereas the actual ratio is that of point B). When the effluent from the source region is, however, first mixed with an auxiliary flow of a hydrogen containing mixture greater than $P_H/P_{He} = 10$ in the mixing region (AC valve in ON position), the ratio $P_H/P_{He}$ increases to that of, for example, curve 1, thus ceasing deposition inasmuch as the existing partial pressure ratio $P_{Zn}/P_{He}$ is lower than that required by the equilibrium constant for the current reaction conditions. As the reaction strives toward equilibrium under these new conditions, any previously-deposited ZnO will be etched from the substrate to satisfy the required equilibrium ratio $P_{Zn}/P_{He}$ at $T_d$, as shown by point C. If the hydrogen-rich auxiliary gas flow is again interrupted, deposition will resume as the equilibrium balance of the vapor-phase system again moves toward point B. If the flow of the auxiliary gas is cyclically modulated, cyclical ZnO deposition and etching can be obtained.

Figure 4A:
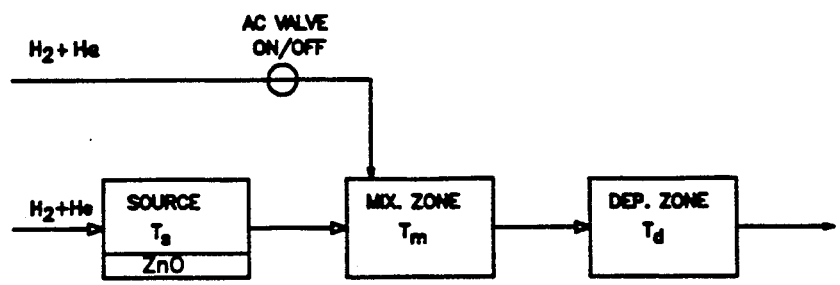
Figure 4B:
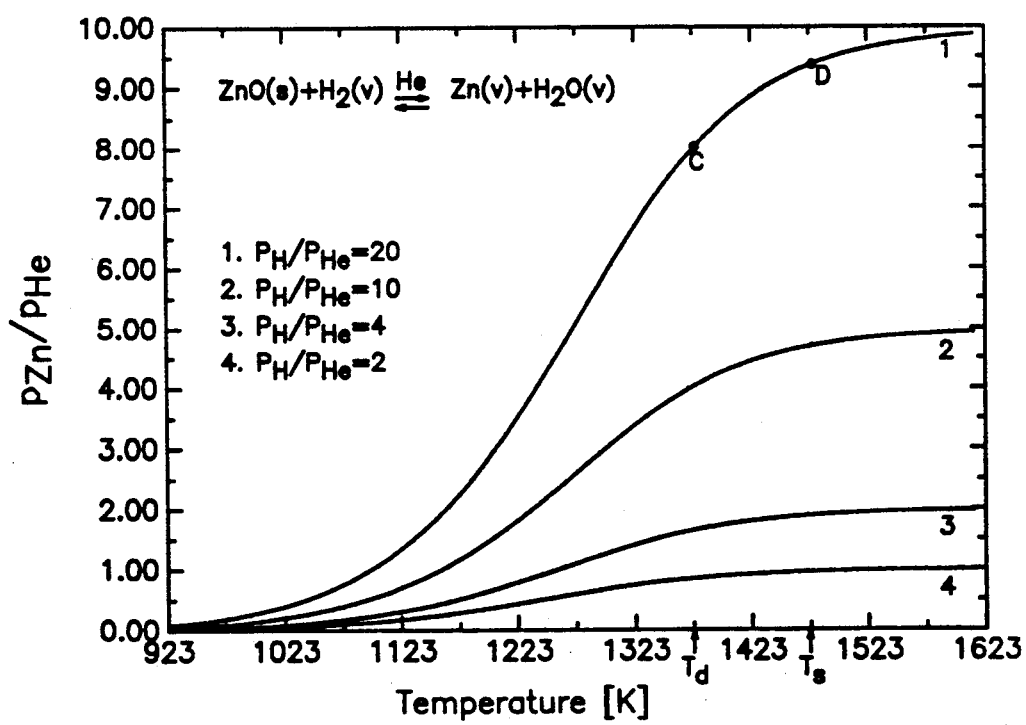

Yet another alternative A.C. mechanism for ZnO deposition is depicted in FIGS. 4A and 4B. This mechanism involves the dilution of the source effluent with a mixture of $H_2$ and He containing the exact same proportions of these gases as existed at equilibrium in the source region of the reactor. The dilution takes place in the mixing region, as shown in FIG. 4A.

If, for example, a source effluent containing $Zn(v)$, $H_2$ and He in the ratios corresponding to that represented by point D on curve 1 of FIG. 4B, i.e, $P_{Zn}/P_{He} \approx 9.3$ and $P_H/P_{HE} = 20$, is transported into a deposition region of the reactor maintained at temperature $T_d$, ZnO deposition occurs inasmuch as the ratio $P_{Zn}/P_{He}$ at equilibrium for temperature $T_d$ should be only approximately 8.0 or that represented by point C. If, however, an above-described auxiliary flow of $H_2$-He gas is bled into the mixing region of the reactor, the ratio $P_{Zn}/P_{He}$ in the deposition region drops to one half the value present at point D, i.e. $\approx 4.65$ (assuming the effluent and auxiliary flow rates are equal). This ratio is smaller than the conditions in the deposition region would require at equilibrium, i.e. point C, causing previously deposited ZnO to be brought into the gas phase. Accordingly, the A.C. cycle is defined by modulating the flow of diluent gas into the mixing region of the reactor.

Figure 5A:
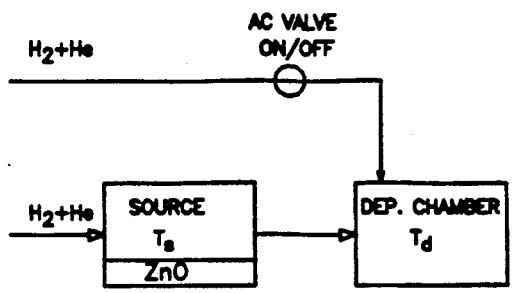
Figure 5B:
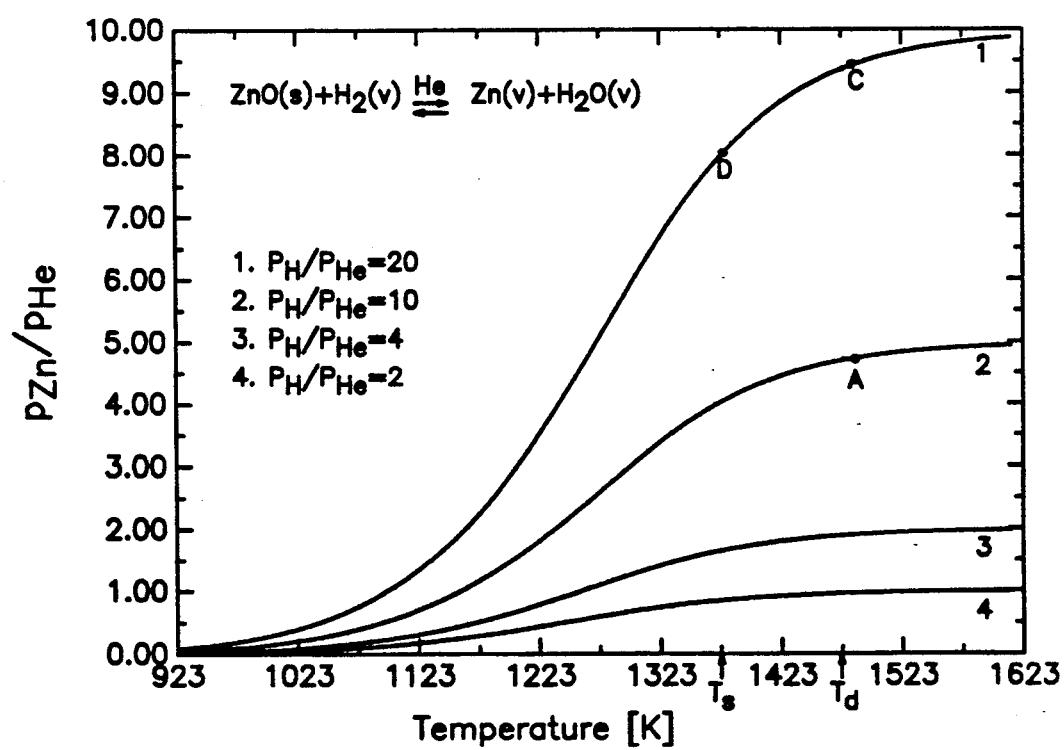

In the three previous embodiments, the temperature $T_d$ of the deposition region is maintained, in the arbitrary examples given, at a level approximately 50° K. less than the temperature $T_s$ of the source region. However, deposition is also possible where $T_s < T_d$. An example of such a process is shown with reference to FIGS. 5A and 5B. Consider, for example, curve 1 in FIG. 5B. When the effluent from the source region exhibiting a ratio $P_{Zn}/P_{He}$ (point corresponding to point D enters the deposition region maintained at a higher temperature $T_d$, no deposition takes place because the equilibrium ratio $P_{Zn}/P_{He}$ C) is higher than that exhibited by the source effluent (point D). If, however, pure He or a He-rich mixture of He and $H_2$ is bled into the deposition region such that the conditions therein require a Zn/He partial pressure ratio equivalent to that at point A on curve 2, ZnO will be deposited, since too much Zn is present in the vapor phase for current conditions. If the auxiliary gas flow is then interrupted, the system will re-equilibrate toward point C on curve 1, etching ZnO in the process.

Figure 6:
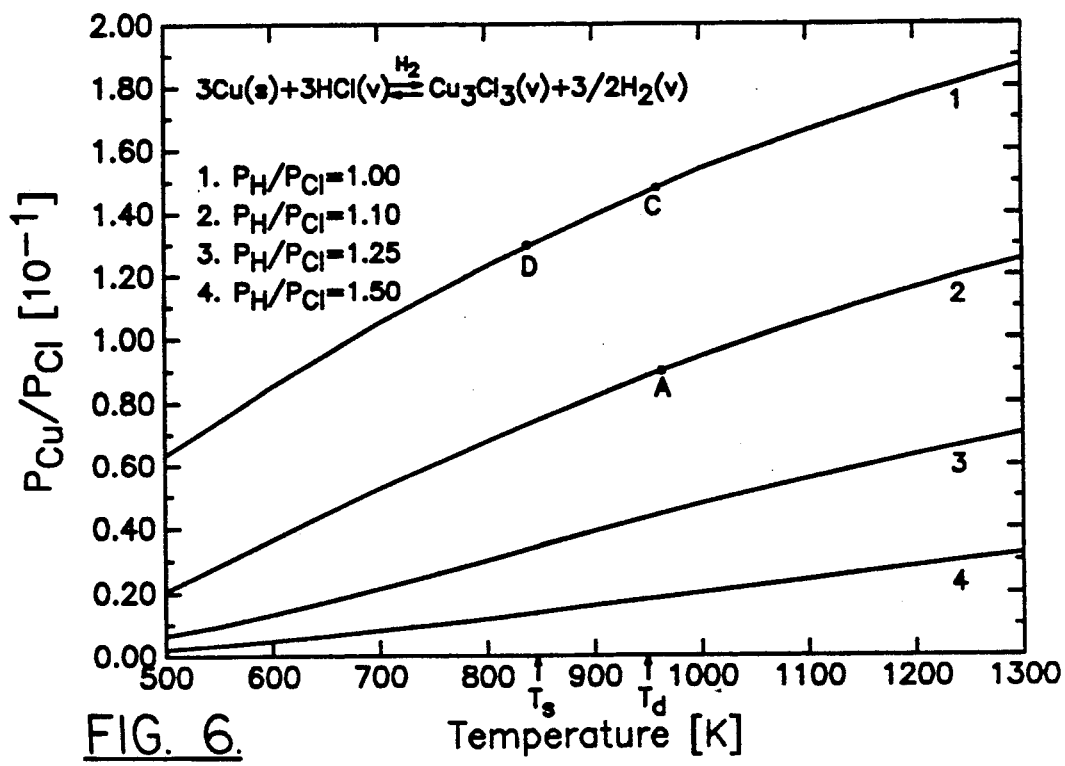
FIG. 6 is a graph depicting the chemistry of copper deposition according to the present invention.

Referring to FIG. 6, an A.C. method for depositing copper according to the present invention will now be described. This method can be implemented according to the following reaction:

$$3Cu(s) + 3HCl(v) \underset{H_2}{\rightleftharpoons} Cu_3Cl_3(v) + 3/2\, H_2(v)$$

In lieu of $H_2$ as a carrier gas, a mixture of $H_2$ and He could be employed. For simplicity, the use of $H_2$ is shown.

FIG. 6 shows a graphical representation of the partial pressure ratio $P_{Cu}/P_{Cl}$ versus temperature for chemical equilibrium systems having different partial pressure ratios $P_H/P_{Cl}$. By modulating the partial pressure ratio $P_H/P_{Cl}$, alternating deposition and etching cycles can be obtained isothermally as the system "moves" from one curve to the other due to the intermittent addition of hydrogen into the system. Depending on whether the ratio $P_{Cu}/P_{Cl}$ in the effluent is higher or lower, respectively, than the equilibrium constant for the conditions present at any given time would require, deposition or etching will occur. For example, if the copper source is maintained at a temperature $T_s = 850°$ K., the deposition region at a higher temperature, e.g. $T_d = 900°$ K., and the effluent partial pressure ratio $P_H/P_{Cl}$ corresponds to that of Curve 1, the effluent will exhibit the ratio $P_{Cu}/P_{Cl}$ represented by point D on curve 1. When this effluent enters the warmer deposition region, no deposition will occur since the actual partial pressure of Cu is then dictated by the equilibrium as represented by point C on curve 1. However, if any Cu is present in the deposition region, etching will occur as the reaction moves toward equilibrium at point C.

If $H_2$ is bled into the deposition region such as to increase the $P_H/P_{Cl}$ ratio to those for example of curve 2, Cu deposition will be called for thermodynamically as the equilibrium strives toward point A. Thus, if this auxiliary gas is cyclically turned ON and then OFF, deposition and etching will cyclically occur respectively even under isothermal conditions.

Other A.C. modulation techniques which are analogous to those described above for ZnO deposition may be used for the deposition of Cu according to the above listed chemical system. Regardless of which modulation technique is used, however, the temperatures of the source, mixing and deposition regions of the reactor, and the partial pressures of the various gases should be chosen to avoid the formation of cuprous chloride, $Cu_2Cl_2$. This can be done by choosing temperatures and partial pressures such that the dew point of $Cu_2Cl_2$ is not exceeded. This means that the temperature for a given set of reactor conditions must not be such that the vapor exhibits a partial pressure of $Cu_2Cl_2$ greater than a solid-phase of $Cu_2Cl_2$ would exhibit at that same temperature.

Figure 7:
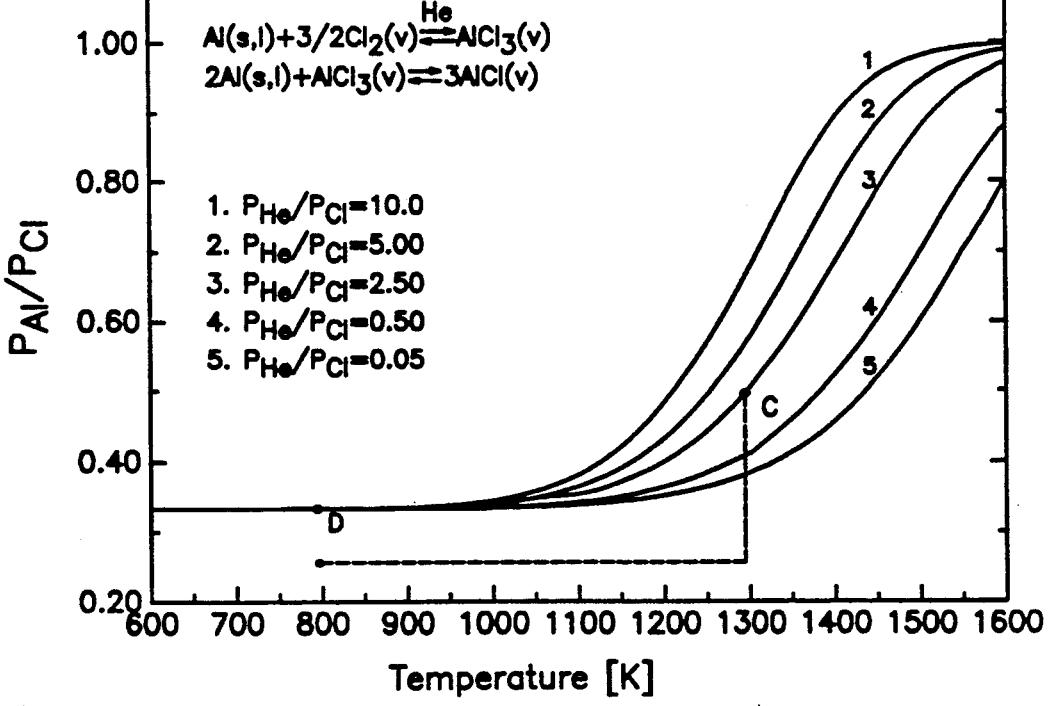
FIG. 7 is a graph depicting the chemistry of aluminum deposition according to the present invention.

FIG. 7 relates to an aluminum deposition process according to the present invention. Each curve represents a different source effluent component ratio $P_{He}/P_{Cl}$. The total pressure of the system is assumed to be 1 atm., although similar results obtain at any total pressure for this and the other exemplified systems. It should be noted that a constraint on Al CVD exists due to the low melting point of Al, i.e. the deposition zone must be at a temperature below the melting point of aluminum. In addition, for the specific chemical system considered, the shapes of the curves also introduce an added clinical difficulty. As set forth in FIG. 7, the chemical system is designed around the following chemical reactions:

$$Al(s) + 3/2\, Cl_2(v) \underset{He}{\rightleftharpoons} AlCl_3(v)$$

$$2Al(s) + AlCl_3(v) \underset{He}{\rightleftharpoons} 3AlCl(v)$$

Liquid aluminum may alternatively be employed as the aluminum source material.

This system can be used to deposit Al by passing a mixture of He and $Cl_2$ over the Al source at temperature $T_s$, point C in FIG. 7. Alternatively, a He/HCl mixture, pure HCl or a mixture of $Cl_2$, $H_2$ and He may be used to create the needed vapor-phase equilibrium system. In any event, the effluent from the source containing the species He, $AlCl_3$, AlCl and $Cl_2$ is introduced into a mixing region maintained at the same or slightly higher temperature than the source region. The vapor-phase system is then transported to the deposition region of the reactor, which is maintained at a temperature below the melting point of aluminum and below the temperature of the mixing region, for example, at the temperature corresponding to point D in FIG. 7. Since $T_m > T_d$, deposition will occur in the deposition region because the equilibrium ratio of $P_{Al}/P_{Cl}$ in the mixed effluent (at temperature $T_m$) is greater than that which should exist at equilibrium at the lower temperature $T_d$. However, if an auxiliary mixture of He and $Cl_2$ having the same proportional makeup as the He/$Cl_2$ mixture in the source region and flowing (for the sake of simplicity) at the same flow rate, is then pulsed in an A.C. fashion into the mixing region of the reactor, the following is expected to occur thermodynamically. First, the actual $P_{Al}/P_{Cl}$ ratio in the mixing region drops to half of the value emanating from the source (see the dashed line in FIG. 7). Second, since this ratio is lower than is required by the conditions in the deposition region (point D), etching of any previously-deposited Al will occur in the deposition region. When this auxiliary gas flow is interrupted, deposition will again resume, etc.

Figure 8:
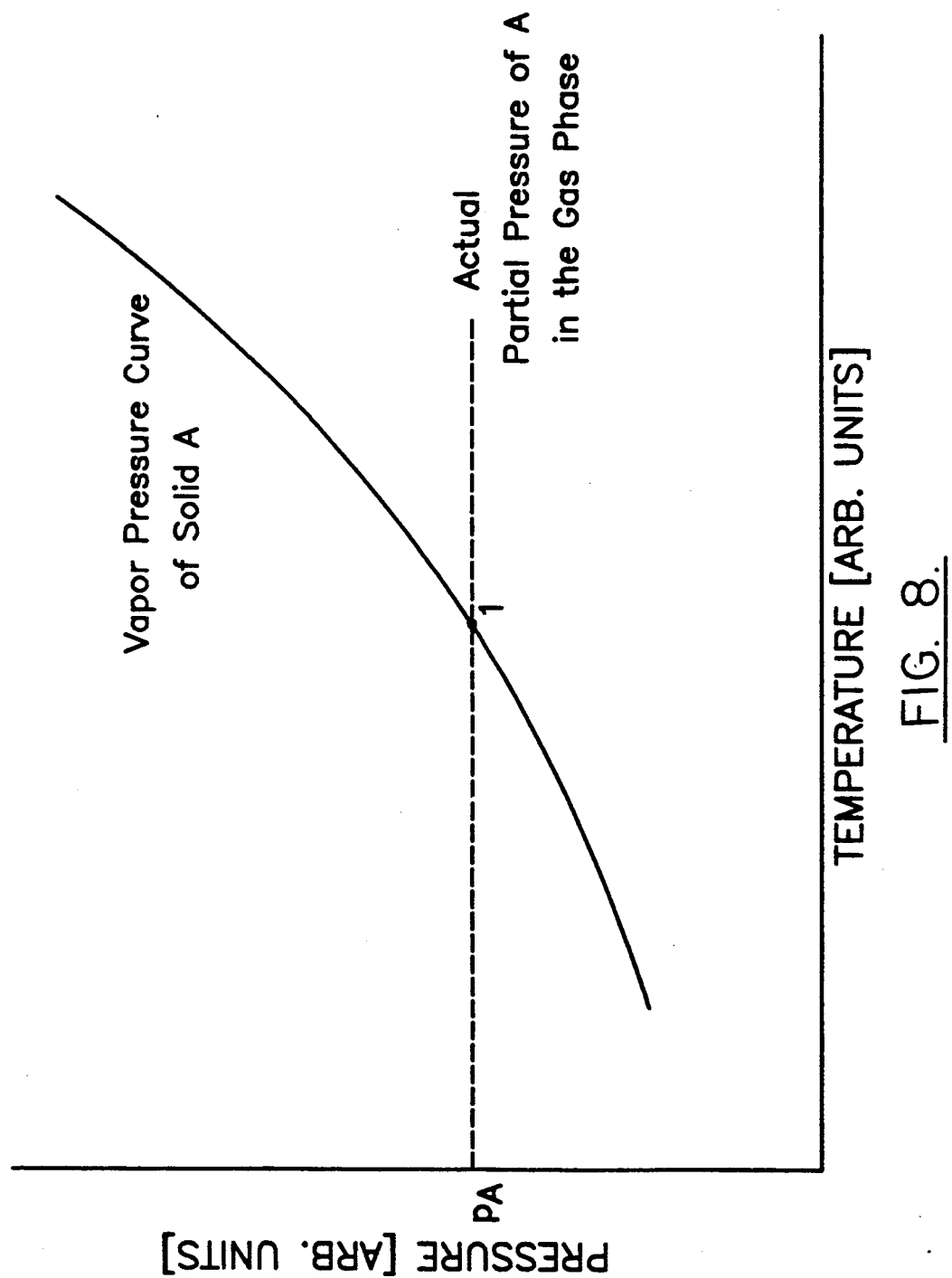
FIG. 8 is a graph of a typical vapor pressure versus temperature curve for a deposited substance.

The formation of the condensed phases of aluminum chloride at the deposition temperature does not present a concern due to the high volatility of this compound. For example, at 800° K., the vapor pressure of $AlCl_3$ is 3.8 atm. Notice that AlCl does not pose a problem since it does not exist as an equilibrium solid phase. T understand the influence of process conditions on the formation of condensed phases, it is useful perhaps to consider FIG. 8. FIG. 8 depicts the vapor pressure curve, as a function of temperature, of a solid substance A which is in equilibrium with its vapor-phase species. To understand FIG. 8, consider vapor containing a partial pressure of $A = P_A$ in the absence of solid and assume the temperature of this vapor phase is lowered. As long as the temperature is maintained above the temperature corresponding to point 1, the substance A will not condense. If, on the other hand, $T < T(1)$, condensation will occur. Point 1 is called the dew point of the substance A, relative to the partial pressure of A, $p_A$, as an example.

Whatever material is being deposited by the disclosed method, the rates of etching and deposition can be adjusted by varying the duration of the ON and OFF cycles of the A.C. valve, the flow rate of the auxiliary gas and the composition of the auxiliary gas as compared to the source effluent.

It will be understood by those having skill in the art that according to the present invention, material layers of arbitrary thickness, such as up to 8000 Å or more, may be deposited. The deposition and etching cycles may be varied over ranges which may be established for each specific system implementation. Generally speaking, these ranges will be a deposit to etch ratio of 2:1 to 4:1. It is also important to not allow deposition to occur too long before interposing an etch cycle. For example, 30 seconds for deposition followed by 10 seconds of etch is preferred to 600 seconds of deposition followed by 200 seconds of etch, even though the deposit to etch ratio in each case is the same. This is to prevent spurious nuclei from growing too large, thereby lowering their surface energy and decreasing their surface/volume atom content. Accordingly, the pulse frequency is as important a variable as is the deposit/etch ratio. In this regard, it should be noted that the auxiliary gas need not be turned entirely OFF during the repetitive deposition or etching cycles. It is sufficient for the purposes of implementing the disclosed process that the flow rate of the auxiliary gas be cyclically increased and decreased within a given range.

Reaction temperature may also be varied over a wide range of temperatures. It will also be understood that the process of the present invention may be employed to deposit materials on any metal surface, silicon (monocrystalline or polycrystalline), other semiconductors, metal silicides or any other thermally stable surfaces to which the materials will adhere, while avoiding deposition on masking films such as silicon dioxide, silicon nitride, aluminum oxide, polyimide or any other surface where deposition is not desired. It should also be understood that in the case of patterned layers of commonly-used masking materials overlaying other commonly employed masking layers, selective deposition may be effected on one and not the other of these layers.

It will be understood by those of skill in the art that the process of the present invention can also be used to deposit blanket layers of materials, taking advantage of the deposition-etch process to deposit superior films as is done, by analogy, in bias sputtering approaches.

Lastly, it will be understood by those, of skill in the art that although vapor-phase curves for the various system have been used in the explanation of this invention, that such curves need not be calculated before any given system can be employed. In any event, however, curves like that shown in this application for the deposition of ZnO, Cu and Al can be calculated by reference to the thermodynamic and kinetic considerations associated with the equilibrium constant K for any chosen system. The utility of the curves is to simplify the definition of the A.C. cycles that can be used for such systems.

In the drawings and specification, there have been disclosed typical preferred embodiments of the invention and, although specific terms are employed, they are used in a generic and descriptive sense only and not for the purpose of limitation, the scope of the invention being set forth in the following claims.

That which is claimed:

1. A process for depositing a predetermined thickness of a solid-phase material on a substrate located in a chemical reactor, said process comprising the steps of:

combining a predetermined quantity of supply components to produce a confined vapor-phase chemical equilibrium system capable of both depositing and etching said material;

transporting said chemical equilibrium system into contact with said substrate;

flowing into said reactor and into a vapor-phase mixture with said chemical equilibrium system an independent flow of an auxiliary gas; and cyclically modulating said flow of said auxiliary gas into said reactor while maintaining the production and transportation of said chemical equilibrium system therein to alternatively stimulate said system toward deposition and then etching of said material on and from said substrate or visa-versa, said cyclical flow modulation being continued for a duration and at a frequency sufficient to yield net deposition of said material on said substrate.

2. A process according to claim 1, wherein said auxiliary gas is selected from the group consisting of at least one of an inert gas, $H_2$ gas, and said supply components.

3. A process according to claim 1 for the deposition of zinc oxide, wherein said supply components comprise ZnO, $H_2$ gas and, optionally, an inert gas.

4. A process according to claim 1 for the deposition of copper, wherein said supply components comprise Cu; a gas mixture selected from the group consisting of $H_2$ gas + HX gas and $H_2$ gas + $X_2$ gas, where X is Cl, Br, F or I; and, optionally, an inert gas.

5. A process according to claim 1 for the deposition of silicon, wherein said supply components comprise Si; a gas mixture selected from the group consisting of HX gas, $H_2$ gas + $X_2$ gas and HX gas + $H_2$ gas, where X is Cl, Br, F or I; and, optionally, an inert gas.

6. A process according to claim 1 for the deposition of aluminum, wherein said supply components comprise Al; and a gas mixture selected from the group consisting of Cl,(v); $H_2$ gas + $Cl_2$(v) and HCl(v); and, optionally, an inert gas.

7. A process according to claim 1 for the deposition of germanium, wherein said supply components comprise Ge; a gas mixture selected from the group consisting of HX gas and H, gas + $X_2$ gas, where X is Cl, Br, F or I; and, optionally, an inert gas.

8. A process according to claim 1 for the deposition of titanium, wherein said supply components comprise Ti; a gas mixture selected from the group consisting of HX gas and $H_2$ gas + $X_2$ gas, where X is Cl, Br, F or I; and, optionally, an inert gas.

9. A process according to claim 1 for the deposition of gallium arsenide, wherein said supply components comprise GAs; a gas mixture selected from the group consisting of HX gas and $H_2$ gas + $X_2$ gas, where X is Cl, Br, F or I; and, optionally, an inert gas.

10. A process according to claim 1 for the deposition of germanium, wherein said supply components comprise Ge, $H_2O$(v) and, optionally, an inert gas.

11. A process according to claim 1 for the deposition of tungsten, wherein said supply components comprise W; a gas mixture selected from the group consisting of HX(v) and $H_2$ gas + $X_2$ gas where X is Cl, Br, F or I; and, optionally, an inert gas.

12. A process according to claim 1, wherein said substrate is selected from the group consisting of refractory metals, nonrefractory metals, refractory metal oxides, nonrefractory metal oxides, refractory metal nitrides, nonrefractory metal nitrides, semiconductors and alloys thereof.

13. A process according to claim 1, wherein said substrate comprises a microelectronic substrate having a masking layer covering selected portions thereof, said process selectively depositing said predetermined thickness of a solid-phase material on said microelectronic substrate, but not on said masking layer.

14. A process according to claim 13, wherein said substrate comprises multiple masking layers.

15. A process according to claim 1, wherein said material is selected from the group consisting of refractory metals, nonrefractory metals, refractory metal oxides, nonrefractory metal oxides, refractory metal nitrides, nonrefractory metal nitrides, semiconductors and alloys thereof.

16. A process according to claim 13, wherein said masking layer is selected from the group consisting of silicon dioxide, silicon nitride, aluminum oxide, and polyimide.

17. A process for depositing a predetermined thickness of a solid phase material on a substrate, comprising the steps of:
   flowing predetermined supply gases adjacent said substrate to produce a chemical equilibrium system capable of both depositing and etching said material on and from said substrate, respectively; and
   cyclicly flowing adjacent said substrate, at least one auxiliary gas selected from the group consisting of said supply gases and gases which are unreactive in said chemical equilibrium system, while continuing to flow said supply gases, to alternatingly stimulate said chemical equilibrium system toward deposition and then etching of said material.

18. A process according to claim 17 for the deposition of zinc oxide, wherein said supply gases comprise $H_2$ gas and, optionally, an inert gas.

19. A process according to claim 17 for the deposition of copper, wherein said supply gases comprise a gas mixture selected from the group consisting of $H_2$ gas+HX gas and $H_2$ gas+$X_2$ gas, where X is Cl, Br, F or I; and, optionally, an inert gas.

20. A process according to claim 17 for the deposition of aluminum, wherein said supply gases comprise a gas mixture selected from the group consisting of $Cl_2(v)$, $H_2$ gas+$Cl_2$ gas and HCl; and, optionally, an inert gas.

21. A process according to claim 17, wherein said substrate is selected from the group consisting of refractory metals, nonrefractory metals, refractory metal oxides, nonrefractory metal oxides, refractory metal nitrides, nonrefractory metal nitrides, semiconductors and alloys thereof.

22. A process according to claim 17, wherein said substrate comprises a microelectronic substrate having a masking layer covering selected portions thereof, said process selectively depositing said predetermined thickness of a solid-phase material on aid microelectronic substrate, but not on said masking layer.

23. A process according to claim 22, wherein said substrate comprises multiple masking layers.

24. A process according to claim 17, wherein said material is selected from the group consisting of refractory metals, nonrefractory metals, refractory metal oxides, nonrefractory metal oxides, refractory metal nitrides, nonrefractory metal nitrides, semiconductors and alloys thereof.

25. A process according to claim 17, wherein said masking layer is selected from the group consisting of silicon dioxide, silicon nitride, aluminum oxide, and polyimide.

26. A chemical reactor assembly for depositing a predetermined thickness of a solid-phase material on a substrate located within said chemical reactor, said reactor assembly comprising:
   means for combining a predetermined quantity of supply components to produce a confined vapor-phase chemical equilibrium system capable of both depositing and etching said material;
   plumbing means for transporting said chemical equilibrium system into contact with said substrate;
   valve means for flowing into said reactor and into a vapor-phase mixture with said chemical equilibrium system an independent flow of an auxiliary gas; and
   control means for cyclically modulating said flow of said auxiliary gas into said reactor while maintaining the production and transportation of said chemical equilibrium system therein to alternatively stimulate said system toward deposition and then etching of said material on and from said substrate, said cyclical flow modulation being continued for a duration and at a frequency sufficient to yield net deposition of said material on said substrate.

27. A reactor assembly according to claim 26, wherein said plumbing means comprises a mixing means for receiving said flow of auxiliary gas from said valve means and for mixing said auxiliary gas with said chemical equilibrium system to produce said vapor-phase mixture.

28. A reactor assembly according to claim 26, further comprising a source region wherein said supply components are combined for the production of said chemical equilibrium system and deposition region located downstream of said source region wherein said chemical equilibrium system comes into contact with said substrate.

29. A reactor assembly according to claim 28, further comprising a mixing region located between said source and deposition regions, said mixing region receiving the flow of said auxiliary gas into said reactor.

* * * * *

UNITED STATES PATENT AND TRADEMARK OFFICE
CERTIFICATE OF CORRECTION

PATENT NO. : 5,201,995
DATED : April 13, 1993
INVENTOR(S) : Reisman et al.

It is certified that error appears in the above-identified patent and that said Letters Patent is hereby corrected as shown below:

Column 10, line 51, please delete "(point".

Column 10, line 54, "$P_{Zn}/P_{He}C$) should be --$P_{Zn}/P_{He}$ (point C)--.

Column 12, line 48, "T" should be --To--.

Column 12, line 59, "<" should be --≤--.

Column 14, line 34, "Cl," should be --$Cl_2$--.

Column 14, line 39, "H," should be --$H_2$--.

Signed and Sealed this

Twenty-second Day of February, 1994

Attest:

BRUCE LEHMAN

*Attesting Officer*     *Commissioner of Patents and Trademarks*

UNITED STATES PATENT AND TRADEMARK OFFICE
CERTIFICATE OF CORRECTION

PATENT NO. : 5,201,995
DATED : April 13, 1993
INVENTOR(S) : Reisman et al.

It is certified that error appears in the above-identified patent and that said Letters Patent is hereby corrected as shown below:

Column 10, line 25, "$P_H/P_{HE}=20$," should be --$P_H/P_{He}=20$,--.

Column 10, line 51, please delete "(point".

Column 10, line 54, "$P_{Zn}/P_{He}C$) should be --$P_{Zn}/P_{He}$ (point C)--.

Column 12, line 48, "T" should be --To--.

Column 12, line 59, "<" should be --≤--.

Column 14, line 34, "Cl," should be --$Cl_2$--.

Column 14, line 39, "H," should be --$H_2$--.

This Certificate supersedes Certificate of Correction issued February 22, 1994.

Signed and Sealed this

Eighth Day of August, 1995

Attest:

BRUCE LEHMAN

*Attesting Officer*  *Commissioner of Patents and Trademarks*